United States Patent
Zhou et al.

(10) Patent No.: US 11,682,882 B2
(45) Date of Patent: *Jun. 20, 2023

(54) LASER SYSTEM WITH STAIRCASED SLOW-AXIS COLLIMATORS

(71) Applicant: PANASONIC INTELLECTUAL PROPERTY MANAGEMENT CO., LTD, Osaka (JP)

(72) Inventors: Wang-Long Zhou, Andover, MA (US); Bryan Lochman, Nashville, TN (US); Bien Chann, Merrimack, NH (US); Matthew Sauter, Cambridge, MA (US)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/507,868

(22) Filed: Oct. 22, 2021

(65) Prior Publication Data

US 2022/0045483 A1 Feb. 10, 2022

Related U.S. Application Data

(63) Continuation of application No. 16/598,001, filed on Oct. 10, 2019, now Pat. No. 11,183,816.

(60) Provisional application No. 62/745,623, filed on Oct. 15, 2018.

(51) Int. Cl.
*H01S 5/40* (2006.01)
*G02B 27/30* (2006.01)
*G02B 27/10* (2006.01)
*H01S 5/02255* (2021.01)

(52) U.S. Cl.
CPC ........ *H01S 5/4012* (2013.01); *G02B 27/1086* (2013.01); *G02B 27/30* (2013.01); *H01S 5/02255* (2021.01); *H01S 5/4087* (2013.01)

(58) Field of Classification Search
CPC .. H01S 5/4012; H01S 5/02255; H01S 5/4087; H01S 5/405; H01S 5/4025; H01S 5/4062; G02B 27/1086; G02B 27/30; G02B 27/0922; G02B 27/1006; G02B 27/1073
See application file for complete search history.

(56) References Cited

U.S. PATENT DOCUMENTS

| 6,894,846 | B1 * | 5/2005 | He | G02B 6/29383 359/722 |
| 8,488,245 | B1 | 7/2013 | Chann et al. | |
| 8,891,579 | B1 * | 11/2014 | Price | H01S 5/4025 372/50.12 |
| 9,455,552 | B1 | 9/2016 | Price et al. | |
| 11,183,816 | B2 * | 11/2021 | Zhou | G02B 27/1086 |
| 2007/0291812 | A1 * | 12/2007 | Petersen | H01S 5/148 372/103 |

(Continued)

OTHER PUBLICATIONS

International Search Report and Written Opinion Corresponding to International Application No. PCT/US2019/055509 dated Jan. 29, 2020, 7 pages.

*Primary Examiner* — Xinning(Tom) Niu
(74) *Attorney, Agent, or Firm* — Morgan, Lewis & Bockius LLP

(57) ABSTRACT

In various embodiments, pointing errors in a non-wavelength-beam-combining dimension of a laser system are at least partially alleviated via staircased collimation lenses.

30 Claims, 8 Drawing Sheets

(56) References Cited

U.S. PATENT DOCUMENTS

| | | | |
|---|---|---|---|
| 2011/0216417 A1* | 9/2011 | Chann | G02B 19/0028 |
| | | | 359/615 |
| 2011/0216792 A1 | 9/2011 | Chann et al. | |
| 2011/0310921 A1 | 12/2011 | Chann et al. | |
| 2012/0033697 A1 | 2/2012 | Goyal et al. | |
| 2012/0105968 A1 | 5/2012 | Chann et al. | |
| 2013/0208361 A1 | 8/2013 | Chann et al. | |
| 2013/0215517 A1 | 8/2013 | Tayebati et al. | |
| 2014/0240831 A1 | 8/2014 | Chann | |
| 2015/0253577 A1 | 9/2015 | Liebowitz et al. | |
| 2015/0303656 A1* | 10/2015 | Morita | H01S 5/143 |
| | | | 372/44.01 |
| 2015/0333485 A1 | 11/2015 | Tayebati et al. | |
| 2015/0362739 A1* | 12/2015 | Zambuto | G02B 19/0057 |
| | | | 359/566 |
| 2015/0364900 A1 | 12/2015 | Chann et al. | |
| 2016/0161752 A1 | 6/2016 | Negoita et al. | |
| 2017/0222401 A1 | 8/2017 | Zimer et al. | |
| 2017/0329147 A1 | 11/2017 | Deutsch et al. | |
| 2020/0119525 A1 | 4/2020 | Zhou et al. | |

* cited by examiner (WBC DIMENSION)

(VIEW A, NON-WBC DIMENSION))

(VIEW A, NON-WBC DIMENSION)

(VIEW A, NON-WBC DIMENSION)

LASER SYSTEM WITH STAIRCASED SLOW-AXIS COLLIMATORS

RELATED APPLICATIONS

This application is a continuation of U.S. patent application Ser. No. 16/598,001, filed Oct. 10, 2019, which claims the benefit of and priority to U.S. Provisional Patent Application No. 62/745,623, filed Oct. 15, 2018, the entire disclosure of each of which is hereby incorporated herein by reference.

TECHNICAL FIELD

In various embodiments, the present invention relates to laser systems, specifically laser systems with particular arrangements of slow-axis collimators.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Various WBC laser systems combine beams emitted by beam emitters along a single direction, or dimension, termed the WBC dimension. Accordingly, WBC systems, or "resonators," often feature their various components lying in the same plane in the WBC dimension. As disclosed in some of the references mentioned above, WBC laser systems often feature diode bars, or other multi-beam emitters, the outputs of which are combined into a single output beam. For compactness and efficiency, each diode bar may be coupled with a fast-axis collimator and an optical rotator (or "optical twister"), which rotate the fast and slow axes of the beams by 90° in the plane normal to the beam propagation direction. In such WBC systems, the slow axis of the beams is in the non-WBC dimension or direction optically downstream of the optical rotator. Thus, the emitters of a single diode bar may all be collimated in the slow axis by a single slow-axis collimation lens (or "slow-axis collimator").

In addition, in order to maximize WBC resonator efficiency, the dispersive element in the WBC system is typically configured at the Littrow angle in the WBC dimension. In order to prevent the first-order reflection from the dispersive element from propagating back to the emitters, the dispersive element may be tilted in the non-WBC direction (i.e., along the slow axis). However, this tilt of the dispersive element results in different compound angles for the different beams incident on the dispersive element and thus induces pointing errors in the slow axis optically downstream of the dispersive element for the beams emitted by the different emitters. Thus, there is a need for improved WBC system designs that prevent such pointing errors and therefore improve efficiency of the systems.

SUMMARY

Systems and techniques in accordance with embodiments of the present invention compensate for pointing errors (e.g., slow-axis pointing errors) induced by, for example, tilt of a dispersive element in a WBC system in the non-WBC direction or dimension. The non-WBC dimension is different from, and in various embodiments is approximately perpendicular to, the WBC dimension in which the beams are combined. In various embodiments, such pointing errors are transformed into beam smear at the dispersive element via manipulation of individual interleaving mirrors. Embodiments of the invention then reduce or substantially eliminate the beam smear using arrays of slow-axis collimation (SAC) lenses that are "staircased," i.e., varying in height and/or position (e.g., vertical position) relative to each other. Each of the SAC lenses is associated with a diode bar or other emitter, and the beams from all of the emitters are combined optically downstream into a multi-wavelength output beam.

In embodiments of the invention, beam emitters (or simply "emitters") may include, consist essentially of, or consist of diode lasers, fiber lasers, fiber-pigtailed diode lasers, etc., and may be packaged individually or in groups as one- or two-dimensional arrays. In various embodiments, emitters or emitter arrays are high-power diode bars with each bar having multiple (e.g., tens of) emitters. The emitters may have micro-lenses attached thereto for emitter collimation and beam shaping. Transform optics, normally confocal and positioned between the emitters and a dispersive element (e.g., a diffraction grating), collimate individual beams from different emitters and converge all the chief rays of the beams toward the center of the grating, particularly in the WBC dimension (i.e., the dimension, or direction, in which the beams are combined). The main beam diffracted by the dispersive element propagates to a partially reflective output coupler, which provides feedback to individual emitters and defines wavelengths of individual emitters via the dispersive element. That is, the coupler reflects a portion of the various beams back to their individual emitters, thereby forming external lasing cavities, and transmits the combined multi-wavelength beam for applications such as welding, cutting, machining, processing, etc. and/or for coupling into one or more optical fibers.

Various embodiments of the invention may be utilized with laser systems featuring techniques for varying BPP of their output laser beams, such as those described in U.S. patent application Ser. No. 14/632,283, filed on Feb. 26, 2015, and U.S. patent application Ser. No. 15/188,076, filed on Jun. 21, 2016, the entire disclosure of each of which is incorporated herein by reference. Laser systems in accordance with embodiments of the invention may also include power and/or spectral monitoring functionality, as detailed in U.S. patent application Ser. No. 16/417,861, filed on May 21, 2019, the entire disclosure of which is incorporated herein by reference. Embodiments of the invention may also incorporate alignment techniques and systems as detailed in U.S. Provisional Patent Application No. 62/797,438, filed on Jan. 28, 2019, the entire disclosure of which is incorporated herein by reference.

Herein, "optical elements" may refer to any of lenses, mirrors, prisms, gratings, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art.

Although diffraction gratings are utilized herein as exemplary dispersive elements, embodiments of the invention may utilize other dispersive elements such as, for example, dispersive prisms, transmission gratings, or Echelle gratings. Embodiments of the invention may utilize one or more prisms in addition to one or more diffraction gratings, for example as described in U.S. patent application Ser. No. 15/410,277, filed on Jan. 19, 2017, the entire disclosure of which is incorporated by reference herein.

Embodiments of the present invention couple multi-wavelength output beams into an optical fiber. In various embodiments, the optical fiber has multiple cladding layers surrounding a single core, multiple discrete core regions (or "cores") within a single cladding layer, or multiple cores surrounded by multiple cladding layers. In various embodiments, the output beams may be delivered to a workpiece for applications such as cutting, welding, etc.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 $\mu m \times 100$ $\mu m$. The beam quality along the 1 $\mu m$ dimension or fast-axis is typically diffraction-limited. The beam quality along the 100 $\mu m$ dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention may also process workpieces at one or more spots or along a one-dimensional linear or curvilinear processing path, rather than flooding all or substantially all of the workpiece surface with radiation from the laser beam. Such one-dimensional paths may be composed of multiple segments, each of which may be linear or curvilinear.

Embodiments of the invention may vary beam shape and/or BPP to improve or optimize performance for different types of processing techniques or different types of materials being processed. Embodiments of the invention may utilize various techniques for varying BPP and/or shape of laser beams described in U.S. patent application Ser. No. 14/632,283, filed on Feb. 26, 2015, U.S. patent application Ser. No. 14/747,073, filed Jun. 23, 2015, U.S. patent application Ser. No. 14/852,939, filed Sep. 14, 2015, U.S. patent application Ser. No. 15/188,076, filed Jun. 21, 2016, U.S. patent application Ser. No. 15/479,745, filed Apr. 5, 2017, and U.S. patent application Ser. No. 15/649,841, filed Jul. 14, 2017, the disclosure of each of which is incorporated in its entirety herein by reference.

In an aspect, embodiments of the invention feature a laser system including, consisting essentially of, or consisting of a plurality of beam emitters each emitting one or more beams, a dispersive element, a plurality of collimators, a plurality of interleaving mirrors, and a partially reflective output coupler. The dispersive element receives the beams and combines the beams, in a wavelength-beam-combining (WBC) dimension, into a multi-wavelength beam. The plurality of collimators are disposed optically downstream of the beam emitters and optically upstream of the dispersive element. Each collimator receives the one or more beams from a beam emitter and collimates the one or more beams in a non-WBC dimension. The plurality of interleaving mirrors are disposed optically downstream of the beam emitters and optically upstream of the dispersive element. The plurality of interleaving mirrors may be disposed optically downstream of the plurality of collimators. The plurality of collimators may be disposed optically downstream of the plurality of interleaving mirrors. Each interleaving mirror reflects the one or more beams from a beam emitter toward the dispersive element. The partially reflective output coupler receives the multi-wavelength beam from the dispersive element, transmits a first portion of the multi-wavelength beam as an output beam, and reflects a second portion of the multi-wavelength beam back toward the dispersive element. The dispersive element is tilted, in the non-WBC dimension, at a non-zero angle such that first-order reflections of the beams from the dispersive element are directed away from the beam emitters, whereby pointing error is introduced into the multi-wavelength beam. One or more of the interleaving mirrors are tilted, in the non-WBC dimension, at a non-zero angle to reduce the pointing error of the multi-wavelength beam, whereby beam smear is introduced in the non-WBC dimension at the dispersive element. Optical axes of two or more of the collimators are displaced from each other in the non-WBC dimension, whereby the beam smear arising from the tilted interleaving mirrors is reduced.

Embodiments of the invention may include one or more of the following in any of a variety of combinations. The non-WBC dimension may correspond to a slow axis of the beams and/or a slow axis of the beam emitters. The non-WBC dimension may correspond to a fast axis of the beams and/or a fast axis of the beam emitters. The dispersive element may include, consist essentially of, or consist of a diffraction grating (e.g., a transmissive diffraction grating or a reflective diffraction grating). At least one of the beam emitters may include, consist essentially of, or consist of a diode bar or other emitter configured to emit a plurality of discrete beams. For a first beam emitter, (i) the tilt of the dispersive element in the non-WBC dimension may introduce a pointing error having a first angle, and (ii) the interleaving mirror associated with the first beam emitter may be tilted in the non-WBC dimension at a second angle. The second angle may be approximately equal to the first angle.

All of the interleaving mirrors may be tilted at a non-zero angle in the non-WBC dimension. Two or more, or even all, of the non-zero tilt angles of the interleaving mirrors may be different from each other. At least two of the interleaving mirrors may be tilted in the non-WBC dimension at different angles. All but one of the interleaving mirrors may be tilted at non-zero angles in the non-WBC dimension. The interleaving mirror associated with a center beam emitter may not be tilted at a non-zero angle in the non-WBC dimension (i.e., the interleaving mirror associated with a center beam emitter may be positioned at an angle of approximately zero (e.g., normal to the incoming beam(s)) in the non-WBC dimension). Two or more of the interleaving mirrors may not be tilted at a non-zero angle in the non-WBC dimension. A second collimator and/or an optical rotator for rotating the one or more beams approximately 90° may be associated with each beam emitter. Each collimator may be a slow-axis collimator and/or each second collimator may be a fast-axis collimator. Each collimator may be a fast-axis collimator and/or each second collimator may be a slow-axis collimator. The plurality of interleaving mirrors may be disposed optically downstream of the plurality of collimators. An optical distance between each of the collimators and the dispersive element may be approximately equal. Heights of two or more of the collimators may be different. Heights of two or more of the collimators may be approximately equal. Heights of all of the collimators may be approximately equal. The laser system may include one or more folding mirrors. One or more folding mirrors may be disposed optically downstream of the dispersive element and optically upstream of the output coupler.

In another aspect, embodiments of the invention feature a laser system including, consisting essentially of, or consisting of a plurality of beam emitters each emitting one or more beams, a dispersive element, a plurality of collimators, and a partially reflective output coupler. The dispersive element receives the beams and combines the beams, in a wavelength-beam-combining (WBC) dimension, into a multi-wavelength beam. The plurality of collimators are disposed optically downstream of the beam emitters and optically upstream of the dispersive element. Each collimator receives the one or more beams from a beam emitter and collimates the one or more beams in a non-WBC dimension. The partially reflective output coupler receives the multi-wavelength beam from the dispersive element, transmits a first portion of the multi-wavelength beam as an output beam, and reflects a second portion of the multi-wavelength beam back toward the dispersive element. The dispersive element is tilted, in the non-WBC dimension, at a non-zero angle such that first-order reflections of the beams from the dispersive element are directed away from the beam emitters, whereby pointing error is introduced into the multi-wavelength beam. Optical axes of two or more of the collimators are displaced from each other in the non-WBC dimension, whereby the pointing error arising from the tilted dispersive element is reduced.

Embodiments of the invention may include one or more of the following in any of a variety of combinations. The non-WBC dimension may correspond to a slow axis of the beams and/or a slow axis of the beam emitters. The non-WBC dimension may correspond to a fast axis of the beams and/or a fast axis of the beam emitters. The dispersive element may include, consist essentially of, or consist of a diffraction grating (e.g., a transmissive diffraction grating or a reflective diffraction grating). At least one of the beam emitters may include, consist essentially of, or consist of a diode bar or other emitter configured to emit a plurality of discrete beams. The collimators may introduce beam smear in the non-WBC dimension at the dispersive element. A second collimator and/or an optical rotator for rotating the one or more beams approximately 90° may be associated with each beam emitter. Each collimator may be a slow-axis collimator and/or each second collimator may be a fast-axis collimator. Each collimator may be a fast-axis collimator and/or each second collimator may be a slow-axis collimator. An optical distance between each of the collimators and the dispersive element may be approximately equal. Heights of two or more of the collimators may be different. Heights of two or more of the collimators may be approximately equal. Heights of all of the collimators may be approximately equal. The laser system may include one or more folding mirrors. One or more folding mirrors may be disposed optically downstream of the dispersive element and optically upstream of the output coupler.

In yet another aspect, embodiments of the invention feature a method of aligning a laser system. The laser system includes, consists essentially of, or consists of (i) a plurality of beam emitters each configured to emit one or more beams, (ii) a dispersive element for receiving the beams and combining the beams, in a wavelength-beam-combining (WBC) dimension, into a multi-wavelength beam, and (iii) a partially reflective output coupler for receiving the multi-wavelength beam from the dispersive element, transmitting a first portion of the multi-wavelength beam as an output beam, and reflecting a second portion of the multi-wavelength beam back toward the dispersive element. Beams emitted by the plurality of beam emitters are combined into the multi-wavelength beam at the dispersive element. Pointing error is introduced into the multi-wavelength beam in a non-WBC dimension. Beam smear is introduced at the dispersive element in the non-WBC dimension to reduce the pointing error of the multi-wavelength beam. The beam smear is reduced without increasing the pointing error of the multi-wavelength beam.

Embodiments of the invention may include one or more of the following in any of a variety of combinations. The pointing error may be introduced into the multi-wavelength beam by tilting the dispersive element at a non-zero angle in the non-WBC dimension. The beam smear may be introduced by tilting one or more interleaver mirrors at a non-zero angle in the non-WBC dimension. The one or more interleaver mirrors may be disposed optically downstream of the beam emitters and optically upstream of the dispersive element. The beam smear may be reduced by displacing optical axes of two or more collimators from each other in the non-WBC dimension. The two or more collimators may be disposed optically downstream of the beam emitters and optically upstream of the dispersive element. The two or more collimators may be slow-axis collimators. The two or more collimators may be fast-axis collimators. The non-WBC dimension may correspond to a slow axis of the beams and/or a slow axis of the beam emitters. The non-WBC dimension may correspond to a fast axis of the beams and/or a fast axis of the beam emitters. The beams may be rotated approximately 90° before combining the beams into the multi-wavelength beam. The beams may be collimated in the WBC dimension and/or the non-WBC dimension.

In another aspect, embodiments of the invention feature a method of aligning a laser system. The laser system includes, consists essentially of, or consists of (i) a plurality of beam emitters each configured to emit one or more beams, (ii) a dispersive element for receiving the beams and combining the beams, in a wavelength-beam-combining (WBC) dimension, into a multi-wavelength beam, and (iii) a partially reflective output coupler for receiving the multi-wavelength beam from the dispersive element, transmitting a first portion of the multi-wavelength beam as an output beam, and reflecting a second portion of the multi-wavelength beam back toward the dispersive element. Beams emitted by the plurality of beam emitters are combined into the multi-wavelength beam at the dispersive element. First-order reflections from the dispersive element are prevented from propagating back to the plurality of beam emitters. Pointing error of the multi-wavelength beam is reduced.

Embodiments of the invention may include one or more of the following in any of a variety of combinations. Preventing the first-order reflections from the dispersive element from propagating back to the plurality of beam emitters may include, consist essentially of, or consist of tilting the dispersive element at a non-zero angle in the non-WBC dimension. The pointing error may be reduced by displacing optical axes of two or more collimators from each other in the non-WBC dimension. The two or more collimators may be disposed optically downstream of the beam emitters and optically upstream of the dispersive element. The two or more collimators may be slow-axis collimators. The two or more collimators may be fast-axis collimators. The non-WBC dimension may correspond to a slow axis of the beams and/or a slow axis of the beam emitters. The non-WBC dimension may correspond to a fast axis of the beams and/or a fast axis of the beam emitters. The beams may be rotated approximately 90° before combining the beams into the multi-wavelength beam. The beams may be collimated in the WBC dimension and/or the non-WBC dimension.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
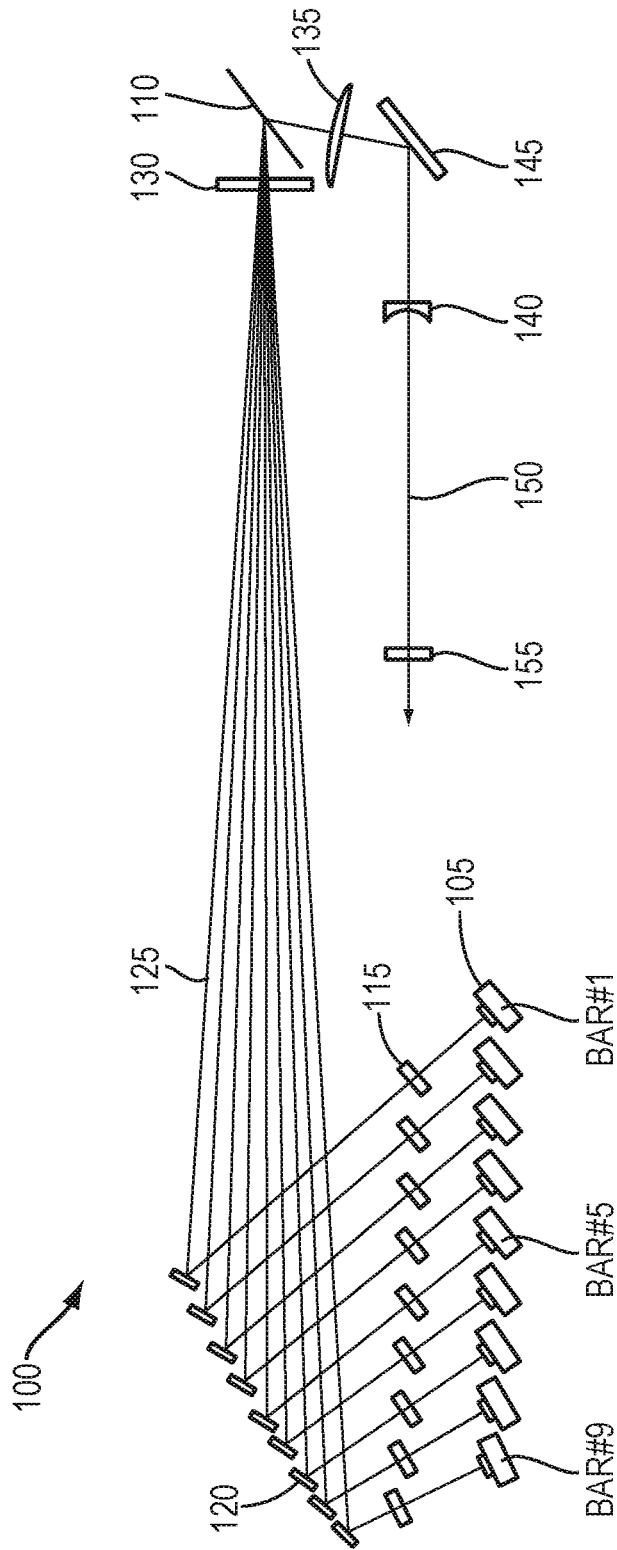
FIG. 1 is a schematic diagram of a wavelength beam combining (WBC) resonator in accordance with embodiments of the invention.

FIG. 1 schematically depicts various components of a WBC resonator 100 that, in the depicted embodiment, combines the beams emitted by nine different diode bars (as utilized herein, "diode bar" refers to any multi-beam emitter, i.e., an emitter from which multiple beams are emitted from a single package). Embodiments of the invention may be utilized with fewer or more than nine emitters. In accordance with embodiments of the invention, each emitter may emit a single beam, or, each of the emitters may emit multiple beams. The view of FIG. 1 is along the WBC dimension, i.e., the dimension in which the beams from the bars are combined. The exemplary resonator 100 features nine diode bars 105, and each diode bar 105 includes, consists essentially of, or consists of an array (e.g., one-dimensional array) of emitters along the WBC dimension. Each emitter of a diode bar 105 emits a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 105 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 105 toward a dispersive element 110. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

Embodiments of the invention presented herein associate both a FAC lens and an optical twister (e.g., as a microlens assembly) with each of the beam emitters and/or emitted beams, and thus SAC lenses (as detailed below) affect the beams in the non-WBC dimension. In other embodiments, the emitted beams are not rotated, and FAC lenses may be utilized to alter pointing angles in the non-WBC dimension. Thus, it is understood that references to SAC lenses herein generally refer to lenses having power in the non-WBC dimension, and such lenses may include FAC lenses in various embodiments. Thus, in various embodiments, for example embodiments in which emitted beams are not rotated and/or the fast axes of the beams are in the non-WBC dimension, FAC lenses may be utilized (i.e., staircased) as detailed herein for SAC lenses.

As shown in FIG. 1, resonator 100 also features a set of SAC lenses 115, one SAC lens 115 associated with, and receiving beams from, one of the diode bars 105. Each of the SAC lenses 115 collimates the slow axes of the beams emitted from a single diode bar 105. After collimation in the slow axis by the SAC lenses 115, the beams propagate to a set of interleaving mirrors 120, which redirect the beams 125 toward the dispersive element 110. The arrangement of the interleaving mirrors 120 enables the free space between the diode bars 105 to be reduced or minimized. Upstream of the dispersive element 110 (which may include, consist essentially of, or consist of, for example, a diffraction grating such as the transmissive diffraction grating depicted in FIG. 1), a lens 130 may optionally be utilized to collimate the sub-beams (i.e., emitted rays other than the chief rays) from the diode bars 105. In various embodiments, the lens 130 is disposed at an optical distance away from the diode bars 105 that is substantially equal to the focal length of the lens 130. Note that, in typical embodiments, the overlap of the chief rays at the dispersive element 110 is primarily due to the redirection of the interleaving mirrors 120, rather than the focusing power of the lens 130.

Also depicted in FIG. 1 are lenses 135, 140, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of which is hereby incorporated by reference herein. Resonator 100 may also include one or more optional folding mirrors 145 for redirection of the beams such that the resonator 100 may fit within a smaller physical footprint. The dispersive element 110 combines the beams from the diode bars 105 into a single, multi-wavelength beam 150, which propagates to a partially reflective output coupler 155. The coupler 155 transmits a portion of the beam as the output beam of resonator 100 while reflecting another portion of the beam back to the dispersive element 110 and thence to the diode bars 105 as feedback to stabilize the emission wavelengths of each of the beams.

Figure 2A:
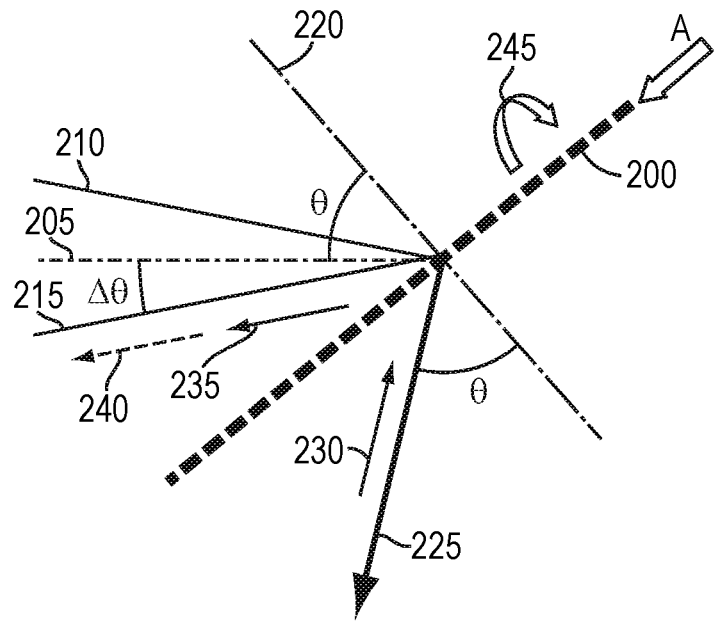
FIG. 2A is a schematic diagram of a dispersive element and various beams in a WBC dimension in accordance with embodiments of the invention.

In various embodiments, the dispersive element 110 is oriented at the Littrow angle, i.e., where the diffraction angle is equal to the angle of incidence, for high diffraction efficiency, at least in the WBC dimension. Since the emitters of each diode bar 105 are necessarily slightly spatially separated in the WBC dimension, a beam from any single emitter will be incident on the dispersive element 110 at an angle slightly different from the incident angles of other beams emitted by the other emitters. That is, typically at most one emitter from each diode bar actually emits a beam striking the dispersive element 110 at the Littrow angle, and the other beams are at angles slightly different from the Littrow angle. Referring to FIG. 2A, the various beams from the diode bars 105 that are incident on the dispersive element 110 at non-Littrow angles may experience issues with feedback. FIG. 2A depicts, in the WBC dimension, a dispersive element 200 configured at the Littrow angle (θ) for a center beam 205 (e.g., the centermost beam (or one of them, for a beam emitter emitting an even number of beams) of a beam emitter 105). Beams 210 and 215 are beams (e.g., adjacent beams, and/or beams distanced away from center beam 205) incident on the dispersive element 200 at angles different from the Littrow angle. Line 220 represents the normal to the dispersive element 200. As mentioned above, the dispersive element 200 combines beams 205, 210, 215 into a single output beam 215 that propagates toward an output coupler (not shown in FIG. 2A). Feedback 230 is received from the output coupler and is separated by the dispersive element 200 into separate components each propagating back to one of the emitters (not shown in FIG. 2A). For example, feedback 235 is the feedback component propagating back to the emitter associated with beam 215.

FIG. 2A also depicts a first-order reflection 240 of the dispersive element 200, which, in the depicted example, also propagates back to the emitter of beam 215. The first-order reflection 240 will compete with the desired feedback beam 235 and thereby result in instability in the wavelength stabilization of beam 215 or even beam 215 being stabilized at the incorrect wavelength. This will result in the power of the WBC resonator being unstable and/or reduced. (Exemplary embodiments of the invention are described herein as featuring a first-order reflection from a dispersive element such as a diffraction grating that is problematic, i.e., may compete with a desired feedback beam and/or create instabilities in emission and/or power. However, the principles, techniques and systems detailed herein in accordance with embodiments of the invention may be applied to cases having higher-order problematic reflections (e.g., second-order reflections, third-order reflections, etc.).)

The wavelength λ1 of the desired feedback 235 and the competing wavelength λ2 of the first-order reflection from the dispersive element 200 may be determined by the equations:

$$\lambda 1 = \frac{\sin(\theta) + \sin(\theta + \Delta\theta)}{p}$$

$$\lambda 2 = \frac{2 \times \sin(\theta + \Delta\theta)}{p}$$

where p is the line density (i.e., lines per unit length) of the dispersive element 200 and (θ+Δθ) is the angle of incidence of beam 215, as shown in FIG. 2A. These equations indicate that the wavelengths λ1 and λ2 are always different, unless Δθ=0, which is the case for the exemplary center beam 205 in FIG. 2A.

Figure 2B:
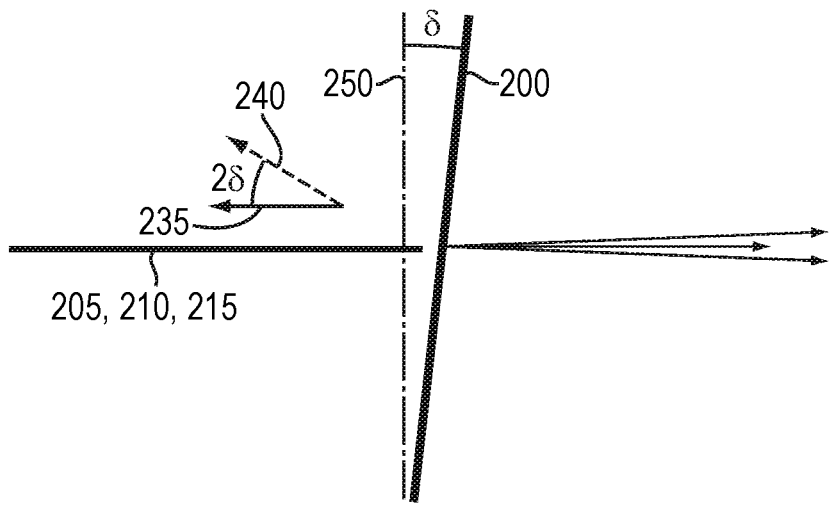
FIGS. 2B-2D are schematic diagrams of a dispersive element and various beams in a non-WBC dimension in accordance with embodiments of the invention.

In order to avoid feedback competition arising from the first-order reflection from the dispersive element, embodiments of the present invention incorporate a slight tilt of the dispersive element 200 in the non-WBC direction, indicated as direction 245 in FIG. 2A. When the dispersive element 200 is tilted by an angle δ, the first-order reflection 240 will propagate at an angle of 2δ relative to feedback from an un-tilted dispersive element, as shown in FIG. 2B, which is a view of FIG. 2B along arrow A. In FIG. 2B, along the non-WBC dimension, the incident beams 205, 210, 215 overlap, and the dashed line 250 indicates the un-tilted orientation of dispersive element 200. (Note that, although illustrative embodiments of the invention describe the dispersive element as being oriented in the Littrow condition in the WBC dimension, this is not necessarily the case; in various embodiments, the dispersive element may be tilted or oriented at a non-Littrow angle in the WBC dimension, and embodiments of the invention still alleviate issues arising from tilt of the dispersive element in the non-WBC direction.)

However, as indicated in FIG. 2B, the tilt of the dispersive element 200 may result in dispersion of the diffracted beam 215 in the non-WBC direction, resulting from small compound angles between the incident beams and the surface of the dispersive element 200 when tilted. This dispersion, or pointing error, of the beams in the non-WBC direction may result in unstable wavelength stabilization and unstable WBC resonator power.

Figure 2C:
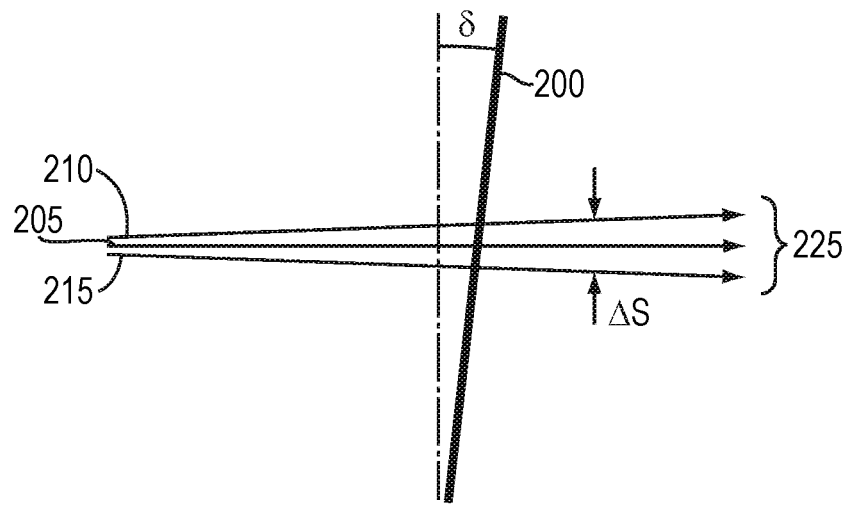
Figure 2D:
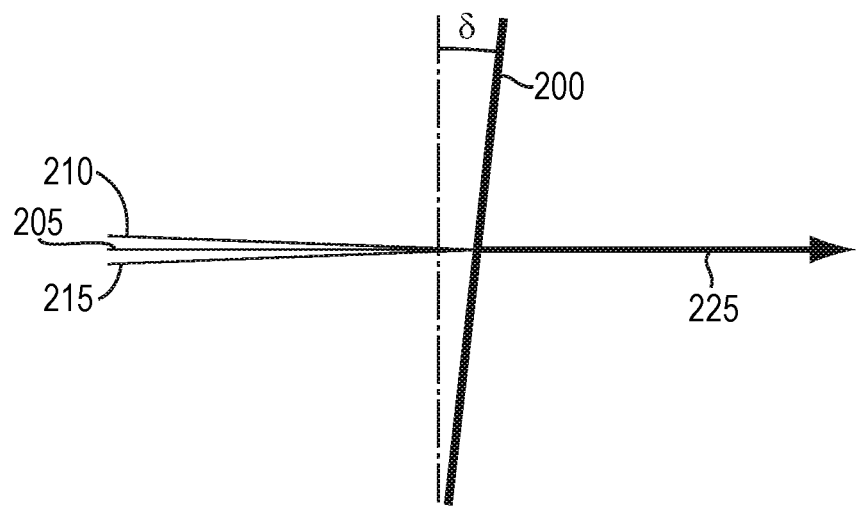

In various embodiments of the invention, as shown in FIG. 2C, the pointing errors from the wavelength-dispersed (i.e., diffracted) beams may be translated into an overall beam smear ΔS at the dispersive element in the non-WBC direction via adjustments of the individual interleaving mirrors reflecting the beams to the dispersive element (i.e., mirrors 120 in FIG. 1). The beam smear degrades the beam quality in the non-WBC direction by (ΔS/S×100)%, where S is the beam size at the dispersive element in the non-WBC dimension. In various embodiments, in order to minimize the resulting smear ΔS, the SAC lenses (e.g., SAC lenses 115 in FIG. 1) may be adjusted (e.g., translated) individually in the non-WBC direction, i.e., the slow axis in FIG. 1 (out of the page). (Equivalently, SAC lenses having their central optical axes disposed at the desired different levels may be utilized; i.e., the SAC lenses may have different sizes, with the central optical axis of each being disposed at the desired level for the staircase. Thus, references here to displacement or adjustment of SAC lenses are understood to be equivalent to usage of SAC lenses having their optical axes at the desired level or location.) FIG. 2D depicts an optimized case in which the pointing errors of the beams are minimized via adjustments of the tilts of the interleaving mirrors 120, and the resulting beam smear is minimized via displacements of the SAC lenses 115 in the non-WBC direction (e.g., slow axis in the example of FIG. 1).

FIGS. 3A, 3B, 4, 5A, and 5B depict the results of a numerical example in accordance with embodiments of the present invention and based on the WBC resonator 100 of FIG. 1. In the example, the dispersive element 110 is tilted in the slow-axis direction by 10 mrad and configured at the Littrow angle (in the WBC dimension) at a center wavelength of 975 nm with other angles of incidence on the dispersive element within ±3° of the Littrow angle. In the example, it is also assumed that each SAC lens 115 collimates the slow axis of the beams of its associated diode bar 105 such that, at the dispersive element 110, the slow-axis beam size is approximately 3.5 mm and the slow-axis divergence is approximately 4 mrad.

Figure 3A:
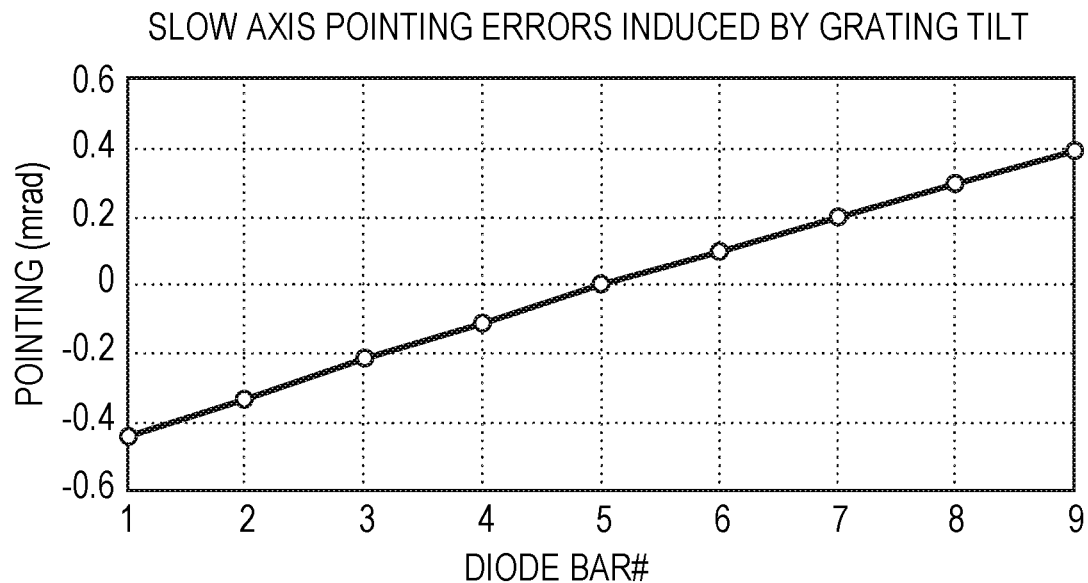
FIG. 3A is a graph of pointing errors of beams in a non-WBC direction induced by a tilt of a dispersive element in accordance with embodiments of the invention.
Figure 3B:
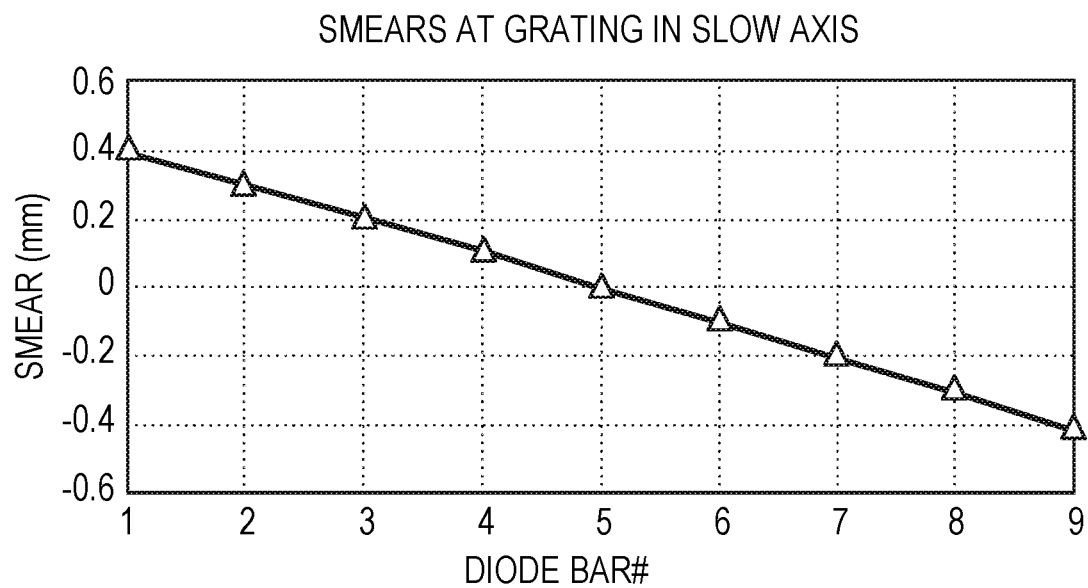
FIG. 3B is a graph of beam smear at the dispersive element when the pointing errors shown in FIG. 3A are reduced to approximately zero in accordance with embodiments of the invention.

FIG. 3A corresponds to the case illustrated in FIG. 2B. FIG. 3A is a graph of the pointing errors of the beams from the various diode bars 120 in the non-WBC direction induced by a tilt of 10 mrad of the dispersive element 110 of resonator 100 of FIG. 1. FIG. 3B corresponds to the case illustrated in FIG. 2C. FIG. 3B is a graph of the beam smear at the dispersive element 110 when the pointing errors shown in FIG. 3A are reduced to approximately zero via individual adjustments of the various interleaving mirrors 120. Note that, in this example, the center diode bar 105 (i.e., diode bar #5 in FIG. 1) has approximately zero pointing error, and thus the interleaving mirror 120 associated with that diode bar 105 (i.e., the interleaving mirror 120 receiving the beams from that diode bar 105) need not be tilted to compensate for pointing errors. Thus, embodiments of the invention include embodiments in which one or more of the interleaving mirrors 120 (e.g., all but one interleaving mirror 120, for example all but the interleaving mirror 120 associated with a center emitter such as a diode bar), but not all of the interleaving mirrors 120, are tilted to compensate for pointing errors. (As used herein, a "center" emitter such as a diode bar is an emitter within a array or line of emitters where approximately the same number of emitters are disposed on either side thereof. For example, the number of emitters on either side of the center emitter may be equal to each other; in other emitters, the number of emitters on one side of the center emitter may be 1, 2, or even 3 more than the number of emitters on the other side of the center emitter.) The pointing errors of approximately ±0.4 mrad in the non-WBC direction (FIG. 3A), which correspond to about 20% of the slow-axis divergence at the dispersive element, may cause significant power loss in the WBC resonator 100. The smear resulting from reduction of the pointing errors (FIG. 3B), i.e., beam displacements at the dispersive element in the slow axis, of approximately ±0.4 mm, may degrade the beam quality in the slow axis by over 20%.

Figure 4:
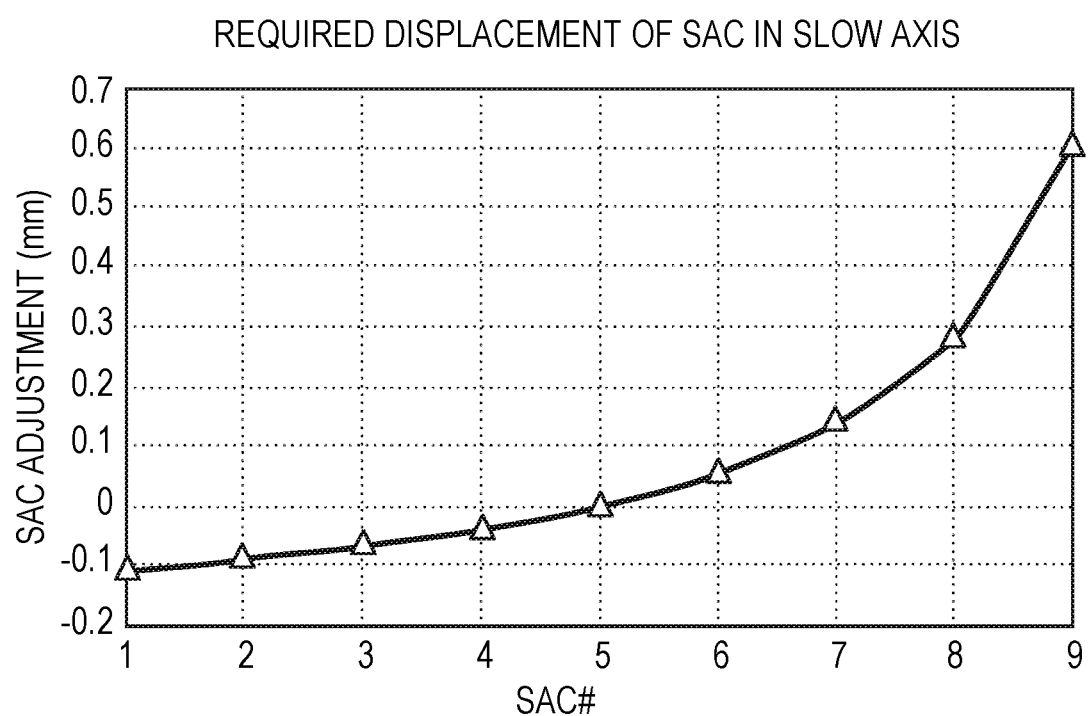
FIG. 4 is a graph of lens displacements utilized to reduce the beam smear of FIG. 3B to approximately zero in accordance with embodiments of the invention.

In various embodiments of the present invention, beam smear in the non-WBC direction (e.g., slow axis) is reduced via individual displacement of the SAC lenses 115 shown in FIG. 1 in the slow axis. FIG. 4 is a graph of the displacements (modeled via ZEMAX simulations) for the SAC lenses 115 required to reduce the beam smear of FIG. 3B to approximately zero. Assuming that the various SAC lenses 115 are approximately the same size and shape, the displacement of the individual SAC lenses corresponds to a displacement of the central optical axes of the SAC lenses by the same amount. As shown in FIG. 4, the SAC lenses 115 may each be displaced by a different amount (even in embodiments in which, as shown in FIG. 1, the spacing between the emitters 105 in the WBC dimension is approximately constant), depending upon the diode bar 105 associated with the SAC lens 115. However, in other embodiments, this "staircase" of SAC lens displacements may include one or more SAC lenses that are displaced or positioned at approximately the same level, in the non-WBC dimension (e.g., the slow axis) as one or more other proximate SAC lenses. Such arrangements may be desirable in embodiments in which there is limited physical space around the SAC lenses, as is may be difficult to realize reliable lens translation adjustment in confined spaces without causing other issues such as inducement of apex roll.

Figure 5A:
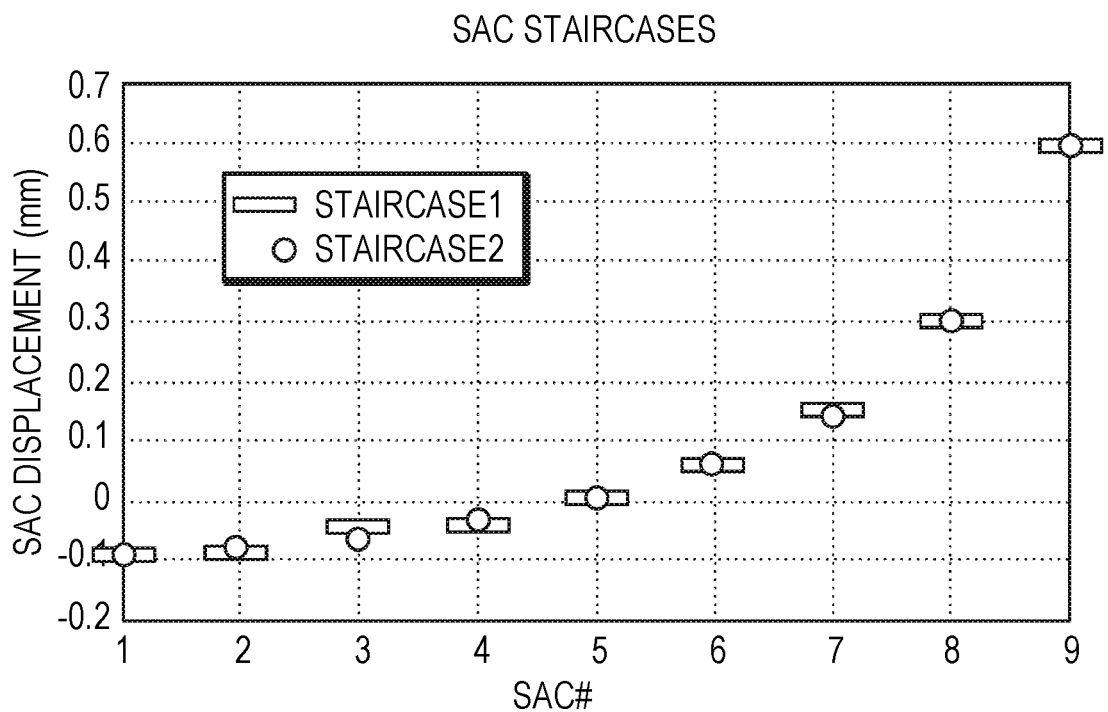
FIG. 5A is a graph of the relative lens displacements for two different arrangements in accordance with embodiments of the invention, based on the curve depicted in FIG. 4.
Figure 5B:
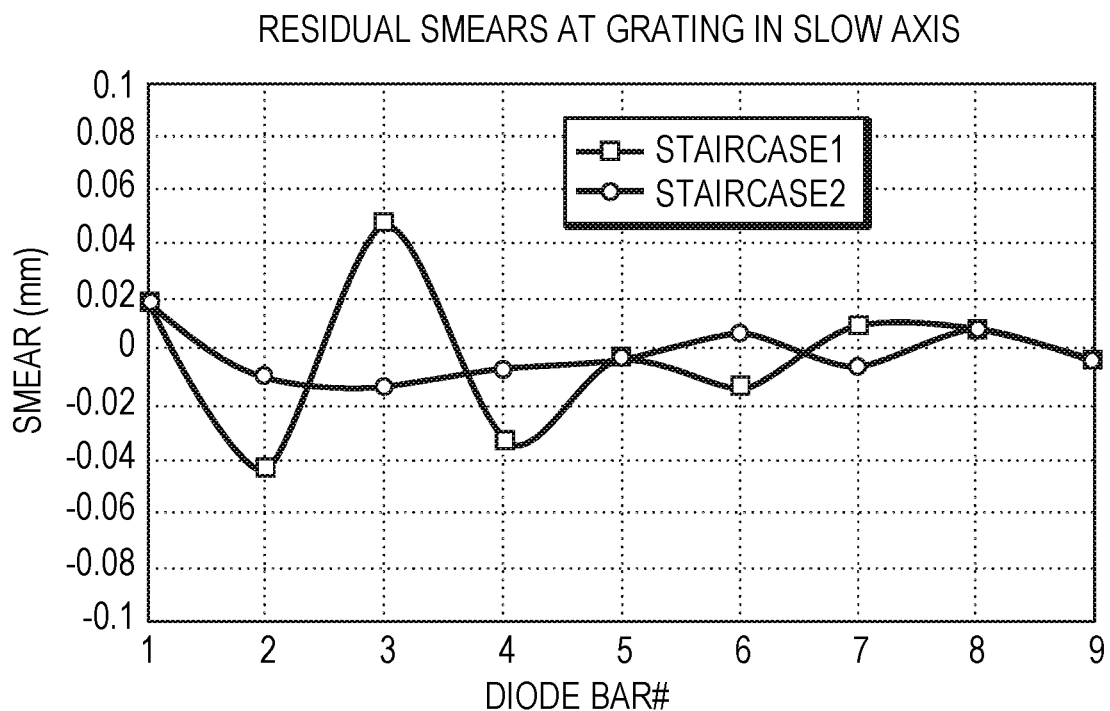
FIG. 5B is a graph of residual beam smear resulting from the lens displacements of FIG. 5A in accordance with embodiments of the invention.

FIG. 5A depicts the relative displacements of the SAC lenses for two different arrangements (or "staircases") in accordance with embodiments of the invention, based on the ideal curve depicted in FIG. 4. The overall heights (i.e., the maximum difference in displacement) for each of the embodiments is the same, approximately 0.7 mm. Because neither embodiment corresponds exactly to the ideal curve of FIG. 4, there is residual beam smear in the slow axis, as shown in FIG. 5B. The table below summarizes the lens displacements for the two cases, labeled Staircase 1 and Staircase 2.

| | SAC # | | | | | | | | |
|---|---|---|---|---|---|---|---|---|---|
| | 1 | 2 | 3 | 4 | 5 | 6 | 7 | 8 | 9 |
| Staircase 1 displacement (mm) | −0.1 | −0.1 | −0.05 | −0.05 | 0 | 0.05 | 0.15 | 0.3 | 0.6 |
| Staircase 2 displacement (mm) | −0.1 | −0.09 | −0.07 | −0.04 | 0 | 0.06 | 0.14 | 0.3 | 0.6 |

As shown, Staircase 1 has fewer different lens displacements, i.e., contains SAC lenses displaced at approximately the same height despite the resulting increase in residual smear. In contrast, Staircase 2 has different lens displacements for each of the lenses and corresponds more closely to the idealized case of FIG. 4, resulting in less residual smear. As shown in FIG. 5B, the full range of residual smear for the two cases is approximately 0.09 mm and 0.03 mm, respectively, corresponding to beam-quality degradations in the slow axis of approximately 2.6% and 0.9%. Embodiments of the invention reduce residual beam smear in the slow axis resulting from tilt adjustment of interleaving mirrors to levels below approximately 3 mm, below approximately 2 mm, below approximately 1 mm, below approximately 0.5 mm, below approximately 0.1 mm, or below approximately 0.05 mm. Embodiments of the invention reduce slow-axis beam degradation resulting from tilt adjustment of interleaving mirrors to levels below approximately 10%, below approximately 8%, below approximately 5%, below approximately 3%, below approximately 2%, or below approximately 1%.

Figure 6A:
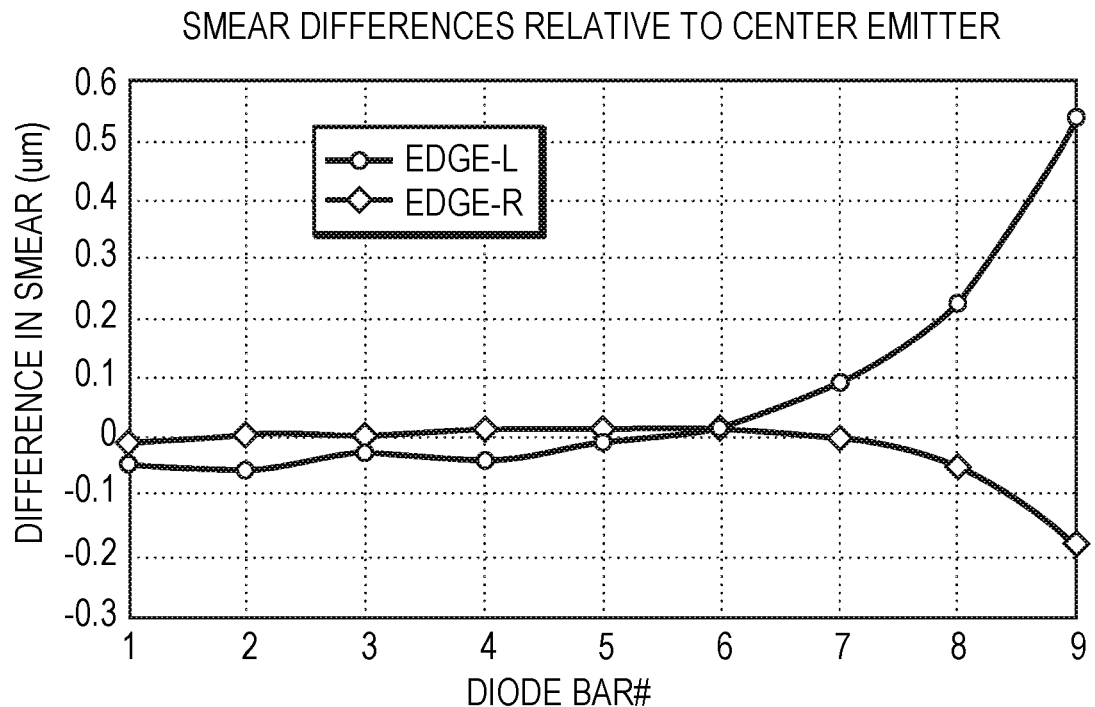
FIG. 6A is a graph of simulated differences in beam smear for left and right edge emitters of a diode bar relative to the center emitter for one of the arrangements of lens displacements of FIG. 5A in accordance with embodiments of the invention.
Figure 6B:
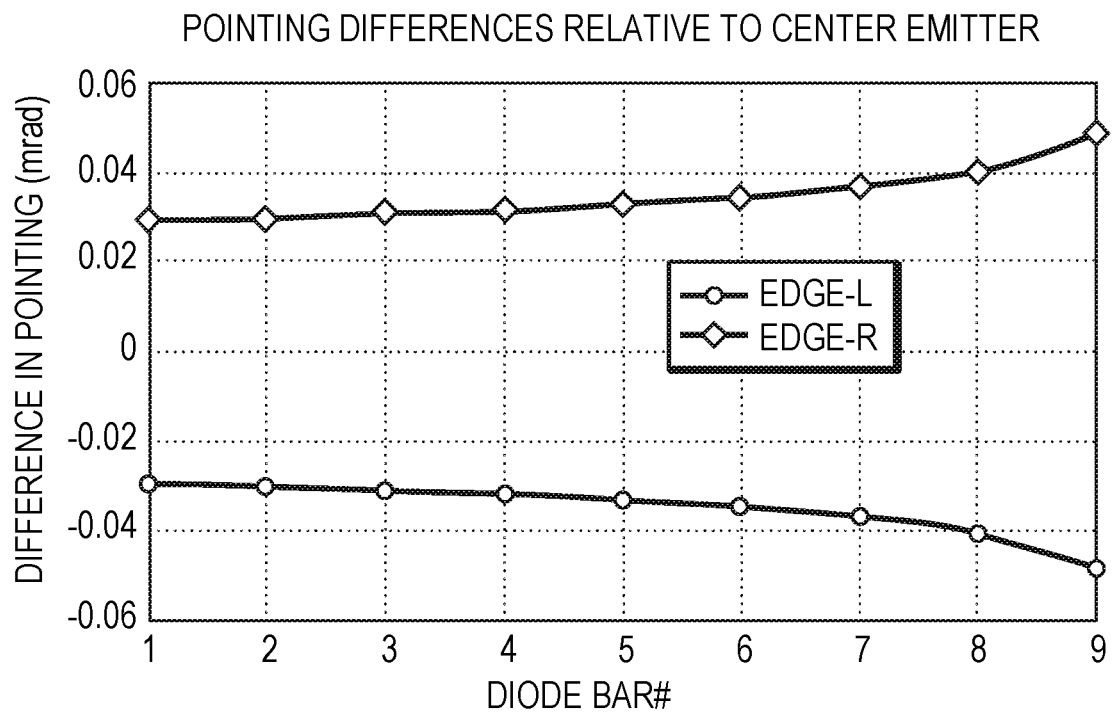
FIG. 6B is a graph of simulated differences in pointing error for left and right edge emitters of a diode bar relative to the center emitter for one of the arrangements of lens displacements of FIG. 5A in accordance with embodiments of the invention.

It is notable that the residual smear of FIG. 5B represents the behavior of only the center emitters of each of the diode bars 105. That is, FIG. 5B may correspond to an example in which each diode bar 105 is replaced by an emitter that emits only a single beam. However, in various embodiments, each of the diode bars 105 has multiple emitters and thus emits multiple beams. In various embodiments, a diode bar 105 or other beam source incorporating multiple emitters may have any number of emitters (and corresponding beams), e.g., more than 8, more than 10, more than 20, more than 30, more than 40, from 10 to 50, or from 19 to 46. As described above, beams from non-central emitters on each bar may exhibit different pointing errors (and resulting beam smear) due to their slightly different angles of incidence on the dispersive element. In various embodiments of the invention, the SAC lens and interleaving mirror for each diode bar are positioned and tilted optimally relative to the center emitter of the diode bar. Thus, it may be desirable to account for pointing errors and beam smear associated with the other emitters of each diode bar. FIGS. 6A and 6B are graphs of simulated differences in smear and pointing errors for the left and right edge emitters of each diode bar relative to the central emitter of the bar. The residual smears resulting from the use of Staircase 1 of FIG. 5B are assumed. In the simulation, a bar width (i.e., distance between the left and right edge emitters) of 9.4 mm is utilized. As shown, the maximum difference in beam smear compared to that of the center emitter is less than 0.6 µm, and the maximum difference in pointing error is less than 0.05 mrad, both of which have negligible impact on the performance of WBC resonator 100.

Figure 7A:
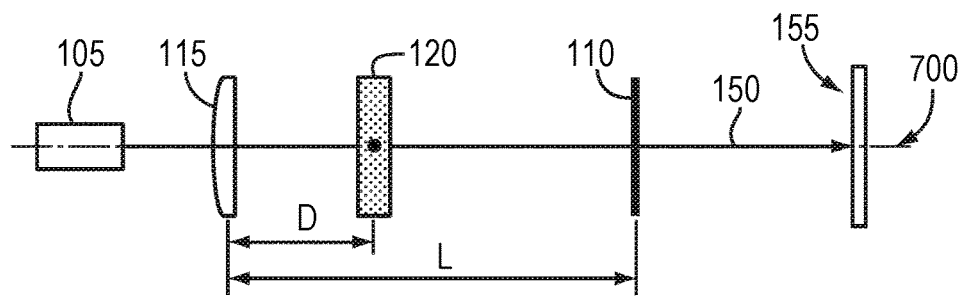
FIGS. 7A-7D are schematic diagrams of a WBC resonator in the non-WBC direction, corresponding to the embodiments depicted in FIGS. 2A-2D, respectively, in accordance with embodiments of the invention.

FIGS. 7A-7D are schematic diagrams of resonator 100 in the non-WBC direction, corresponding to the cases described in relation to FIGS. 2A-2D, respectively. Each of FIGS. 7A-7D includes a single diode bar 105, the SAC lens 115 and interleaving mirror 120 associated with the diode bar 105, the dispersive element 110, and the output coupler 155. Other components of the resonator 100 have been omitted for simplicity. In FIG. 7A, the resonator beam 150 is propagating from the diode bar 105 to the output coupler 155 and is represented by a solid line. Since in the case of FIG. 7A the dispersive element 110 is not tilted, the resonator beam 150 overlaps the center line 700 perpendicular to the output coupler 155, and the first-order reflection of the beam in the non-WBC dimension may deleteriously interfere with the feedback beam from the output coupler 155 (i.e., by propagating back to the emitter). The black dot on the interleaving mirror 120 represents the point at which the resonator beam strikes the mirror 120 and is reflected toward the dispersive element 110.

Figure 7B:
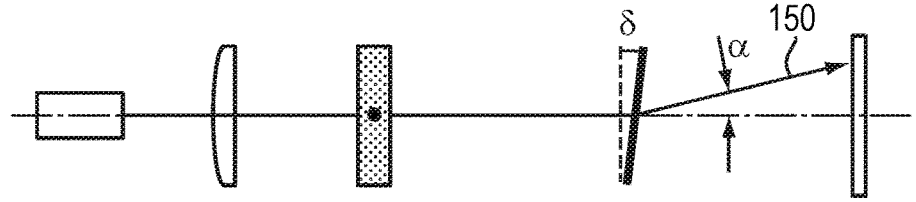

As shown in FIG. 7B, when the dispersive element 110 is tilted in the non-WBC direction (e.g., the slow axis) by an angle δ, a pointing error having an angle α is induced in the resonator beam 150. The pointing error angle α (in mrad) is approximately proportional to the tilt angle δ (in mrad) of the dispersive element 110 and the grating line density p of the dispersive element (in lines/µm). The pointing error angle is also approximately proportional to the tangent of Δθ, the off-Littrow (in the WBC direction) angle of incidence of the beam (as detailed above relative to FIG. 2A). These relationships may be expressed by the equation α≈0.5×δ×p×tan(Δθ). In various embodiments of the invention, the dispersive element 110 may be tilted in the non-WBC direction (i.e., the slow axis) by an angle of up to 5 mrad, up to 10 mrad, up to 15 mrad, up to 20 mrad, up to 25 mrad, or even up to 30 mrad. The tilt may be, in various embodiments, at least 1 mrad, at least 2 mrad, at least 3 mrad, or even at least 5 mrad.

Figure 7C:
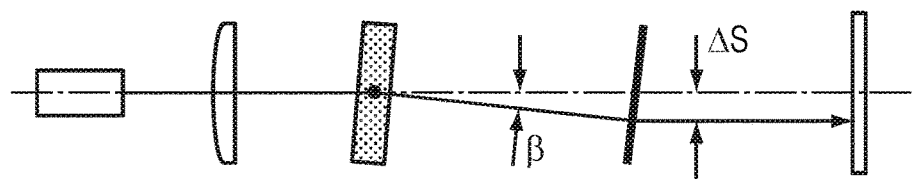

As shown in FIG. 7C, the tilt of the interleaving mirror 120 may be adjusted by an angle β in the non-WBC dimension (e.g., the slow axis) in order to eliminate the pointing error angle α, which may cause unstable wavelength stabilization. In various embodiments of the invention, the tilt δ of the dispersive element 110 is larger (e.g., approximately 10× larger, or even 100× larger) than the pointing error angle α. And, in various embodiments of the invention, the interleaving mirror tilt β is approximately equal to the pointing error angle α.

Figure 7D:
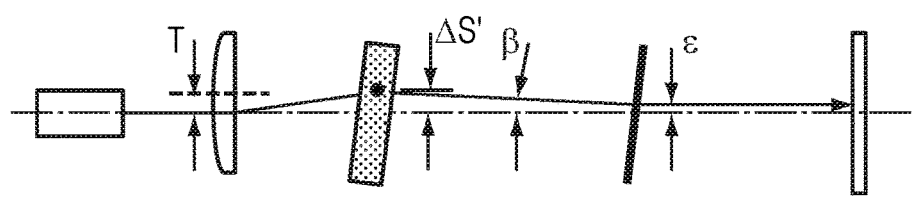

As detailed herein, correction of the pointing errors in the non-WBC direction resulting from tilt of the dispersive element typically results in increased beam smear in the non-WBC direction at the dispersive element. This beam smear is represented by ΔS in FIG. 7C. As shown in FIG. 7D, displacing the SAC lens 115 (i.e., such that the beam does not strike the vertical center and/or optical axis of the SAC lens 115) in the non-WBC dimension (e.g., the slow axis) by an amount T results in an offset of the beam position at the interleaving mirror 120 of an amount ΔS'. As indicated in FIG. 7D, this offset at the interleaving mirror ΔS' is, in various embodiments:

$$\Delta S' = D \times \frac{T}{f} = (L - D) \times \beta + \varepsilon$$

where f is the focal length of the SAC lens 115, D is the optical distance between the SAC lens 115 and the interleaving mirror 120, L is the optical distance between the SAC lens 115 and the dispersive element 110, and ε is the residual beam smear at the dispersive element 110. Since in embodiments of the invention the residual beam smear is reduced to approximately zero, and since, as detailed above, β is approximately equal to the pointing error angle α, the displacement T of the SAC lens may be expressed as:

$$T \approx \alpha \times f \times \frac{L}{D-1} \approx 0.5 \times \delta \times p \times \tan(\Delta\theta) \times f \times \frac{L}{D-1}.$$

In various embodiments of the invention, the optical distance L from the SAC lens 115 to the dispersive element 110 is approximately equal for all of the different emitters. Thus, in accordance with embodiments of the invention, the SAC staircase, i.e., the array of SAC lens offsets/displacements, may be approximately represented by:

$$T_k = 0.5 \times \delta \times p \times \tan(\Delta\theta_k) \times f \times \frac{L}{D_k - 1}$$

where the subscript k represents each beam emitter, i.e., k=1, 2, . . . , n, where n is the number of beam emitters. As evident from this equation, the smaller the distance from the SAC lens 115 to the interleaving mirror 120, the larger the SAC lens offset that is required. In embodiments in which the optical distance D from the SAC lens 115 to the interleaving mirror 120 is approximately the same for each beam emitter, the SAC staircase offsets will follow a linear or substantially linear relationship proportional to $\Delta\theta_k$. Other embodiments of the invention, such as those shown in FIGS. 4 and 5A, include substantially parabolic SAC lens staircase relationships, due at least in part to the fact that $T_k$ is inversely proportional to $D_k$ in such embodiments. In accordance with embodiments of the invention, the optical distances D between various SAC lenses and their corresponding interleaving mirrors may vary, and thus the shape of the SAC lens staircase is not limited to linear (or substantially linear) or parabolic (or substantially parabolic), and the SAC lens staircase may not even increase monotonically; rather, it may increase stepwise (e.g., with one, two, or more steps in displacement).

Embodiments of the invention may include SAC lens staircases even in WBC resonators in which interleaving mirrors are not utilized. In such embodiments, the SAC lens staircase may be defined as approximately:

$$T_k = 0.5 \times \delta \times p \times \tan(\Delta\theta_k) \times f.$$

In such embodiments, the displacements of the array of SAC lenses will substantially eliminate pointing errors introduced by tilt of the dispersive element but may result in residual uncompensated beam smear at the dispersive element. Such beam smear may be calculated as approximately:

$$\Delta S_k = \frac{L}{f \times T_k}.$$

For example, the same numerical example described above, but without the use of interleaving mirrors, results in an overall beam smear at the dispersive element of over 0.9 mm, corresponding to over 25% beam quality degradation in the slow axis.

Figure 7E:
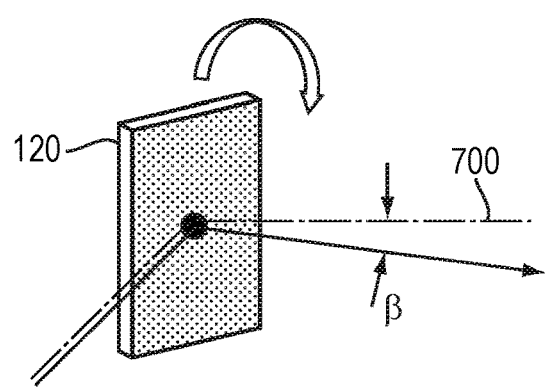
FIG. 7E is a perspective view of an exemplary interleaving mirror tilted as depicted in FIG. 7C in accordance with embodiments of the invention.

FIG. 7E depicts a perspective view of an exemplary interleaving mirror 120 tilted as shown in FIG. 7C. The solid line corresponds to the incident beam, which is depicted relative to the centerline 700 from FIG. 7C. As shown, the interleaving mirror 120 is tilted (i.e., rotated) in the non-WBC (e.g., slow-axis) dimension, and the incident beam is reflected from the interleaving mirror 120 at an angle β in the non-WBC (e.g., slow axis) direction.

In various embodiments of the invention, the offset displacement of a SAC lens is no more than approximately 5% of its focal length, or even no more than approximately 3% of its focal length. For example, in the above numerical example utilizing SAC lenses having focal lengths of 50 mm, the largest displacement of the SAC lens staircase may be limited to approximately 2.5 mm or less, or even to approximately 1.5 mm or less. In various embodiments of the invention, the offset displacement of a SAC lens may be at least approximately 0.1%, at least approximately 0.2%, at least approximately 0.5%, or at least approximately 1% of its focal length.

In embodiments of the invention, the overall height of a SAC lens staircase (i.e., range of displacements of the SAC lens array) may be reduced by setting the dispersive element at an angle less than the Littrow angle (in the WBC direction) for the center (or, in various embodiments, sole) emitter. Such embodiments may exhibit slightly lower diffraction efficiency and slightly lower dispersion power of the dispersive element. For the numerical example provided above, setting the tilt angle of the dispersive element to 1° less than the Littrow angle decreases the overall SAC lens staircase height from about 0.7 mm to about 0.4 mm.

In various embodiments, the SAC lens staircase may be achieved via displacement (e.g., vertical displacement, perpendicular to the beam incidence direction) of one or more of the SAC lenses in the WBC resonator. In other embodiments, the different SAC lenses may each have a different height in the slow-axis direction, so that the center point of each lens (e.g., the optical axis) is disposed at the proper level. In such embodiments, the bases of the various SAC lenses may be (but are not necessarily) substantially coplanar, while the centers of the SAC lenses are offset by the desired amounts. In various embodiments, both the position (e.g., the base position) and the height of two or more of the SAC lenses may vary within a staircase.

In various embodiments, the various SAC lenses are disposed on a substantially planar platform, and the SAC lenses are displaced at various heights over the base via, e.g., spacers, or lens bases, of varying heights or thicknesses. In other embodiments, the various SAC lenses and any bases thereof may be approximately identical in size and shape, and the common platform may itself define areas of different heights (e.g., mesas or other protrusions) on which the SAC lenses may be placed at the appropriate locations. In various embodiments, the displacement of one or more of the SAC lenses may be adjusted after installation on the common platform via, e.g., one or more actuators.

In various embodiments, beam smear and/or pointing errors of various beams may be detected, for subsequent correction via mirror tilting and/or lens displacement, via a detection system that de-multiplexes overlapped beams for examination of the individual beam components thereof, as described in U.S. Provisional Patent Application No. 62/797,438, filed on Jan. 28, 2019, the entire disclosure of which is incorporated herein by reference. For example, beam smear and/or pointing errors may be detected, and the tilt and/or displacement of individual components may be adjusted by a human operator or by a computer-controlled control system (and mechanical adjusters such as actuators, worm gears, etc.) that thusly minimizes the observed beam smear and/or pointing error.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A laser system comprising:
a plurality of beam emitters each emitting one or more beams;
a dispersive element for receiving the beams and combining the beams, in a wavelength-beam-combining (WBC) dimension, into a multi-wavelength beam;
a plurality of collimators disposed optically downstream of the beam emitters and optically upstream of the dispersive element, wherein each collimator receives the one or more beams from a beam emitter and collimates the one or more beams in a non-WBC dimension; and
a partially reflective output coupler for receiving the multi-wavelength beam from the dispersive element, transmitting a first portion of the multi-wavelength beam as an output beam, and reflecting a second portion of the multi-wavelength beam back toward the dispersive element,
wherein:
the dispersive element is tilted, in the non-WBC dimension, at a non-zero angle such that first-order reflections of the beams from the dispersive element are directed away from the beam emitters, whereby pointing error is introduced into the multi-wavelength beam, and
optical axes of two or more of the collimators are displaced from each other in the non-WBC dimension, whereby the pointing error arising from the tilted dispersive element is reduced.

2. The laser system of claim 1, wherein the non-WBC dimension corresponds to a slow axis of the beams.

3. The laser system of claim 1, wherein the non-WBC dimension corresponds to a fast axis of the beams.

4. The laser system of claim 1, wherein the dispersive element comprises a diffraction grating.

5. The laser system of claim 1, wherein at least one of the beam emitters comprises a diode bar configured to emit a plurality of discrete beams.

6. The laser system of claim 1, wherein the collimators introduce beam smear in the non-WBC dimension at the dispersive element.

7. The laser system of claim 1, further comprising, associated with each beam emitter, (i) a second collimator, and (ii) an optical rotator for rotating the one or more beams approximately 90°.

8. The laser system of claim 7, wherein each collimator is a slow-axis collimator and each second collimator is a fast-axis collimator.

9. The laser system of claim 1, wherein an optical distance between each of the collimators and the dispersive element is approximately equal.

10. The laser system of claim 1, wherein heights of two or more of the collimators are different.

11. The laser system of claim 1, wherein heights of two or more of the collimators are approximately equal.

12. The laser system of claim 1, wherein heights of all of the collimators are approximately equal.

13. The laser system of claim 1, further comprising one or more folding mirrors disposed optically downstream of the dispersive element and optically upstream of the output coupler.

14. A method of aligning a laser system comprising (i) a plurality of beam emitters each configured to emit one or more beams, (ii) a dispersive element for receiving the beams and combining the beams, in a wavelength-beam-combining (WBC) dimension, into a multi-wavelength beam, and (iii) a partially reflective output coupler for receiving the multi-wavelength beam from the dispersive element, transmitting a first portion of the multi-wavelength beam as an output beam, and reflecting a second portion of the multi-wavelength beam back toward the dispersive element, the method comprising:
combining beams emitted by the plurality of beam emitters into the multi-wavelength beam at the dispersive element;
preventing first-order reflections from the dispersive element from propagating back to the plurality of beam emitters; and
reducing pointing error of the multi-wavelength beam.

15. The method of claim 14, wherein preventing the first-order reflections from the dispersive element from propagating back to the plurality of beam emitters comprises tilting the dispersive element at a non-zero angle in the non-WBC dimension.

16. The method of claim 14, wherein the pointing error is reduced by displacing optical axes of two or more collimators from each other in the non-WBC dimension, the two or more collimators being disposed optically downstream of the beam emitters and optically upstream of the dispersive element.

17. The method of claim 16, wherein the two or more collimators are slow-axis collimators.

18. The method of claim 16, wherein the two or more collimators are fast-axis collimators.

19. The method of claim 14, wherein the non-WBC dimension corresponds to a slow axis of the beams.

20. The method of claim 14, wherein the non-WBC dimension corresponds to a fast axis of the beams.

21. The method of claim 14, further comprising rotating the beams approximately 90° before combining the beams into the multi-wavelength beam.

22. A method of aligning a laser system comprising (i) a plurality of beam emitters each configured to emit one or more beams, (ii) a dispersive element for receiving the beams and combining the beams, in a wavelength-beam-combining (WBC) dimension, into a multi-wavelength beam, and (iii) a partially reflective output coupler for receiving the multi-wavelength beam from the dispersive element, transmitting a first portion of the multi-wavelength beam as an output beam, and reflecting a second portion of the multi-wavelength beam back toward the dispersive element, the method comprising:
combining beams emitted by the plurality of beam emitters into the multi-wavelength beam at the dispersive element;
introducing pointing error into the multi-wavelength beam in a non-WBC dimension;
introducing beam smear at the dispersive element in the non-WBC dimension to reduce the pointing error of the multi-wavelength beam; and
reducing the beam smear without increasing the pointing error of the multi-wavelength beam.

23. The method of claim 22, wherein the pointing error is introduced into the multi-wavelength beam by tilting the dispersive element at a non-zero angle in the non-WBC dimension.

24. The method of claim 22, wherein the beam smear is introduced by tilting one or more interleaver mirrors at a non-zero angle in the non-WBC dimension, the one or more interleaver mirrors being disposed optically downstream of the beam emitters and optically upstream of the dispersive element.

25. The method of claim 22, wherein the beam smear is reduced by displacing optical axes of two or more collimators from each other in the non-WBC dimension, the two or more collimators being disposed optically downstream of the beam emitters and optically upstream of the dispersive element.

26. The method of claim 25, wherein the two or more collimators are slow-axis collimators.

27. The method of claim 25, wherein the two or more collimators are fast-axis collimators.

28. The method of claim 22, wherein the non-WBC dimension corresponds to a slow axis of the beams.

29. The method of claim 22, wherein the non-WBC dimension corresponds to a fast axis of the beams.

30. The method of claim 22, further comprising rotating the beams approximately 90° before combining the beams into the multi-wavelength beam.

* * * * *